United States Patent
Ohtake

(10) Patent No.: US 7,315,062 B2
(45) Date of Patent: Jan. 1, 2008

(54) SEMICONDUCTOR DEVICE, MASK FOR IMPURITY IMPLANTATION, AND METHOD OF FABRICATING THE SEMICONDUCTOR DEVICE

(75) Inventor: Fumio Ohtake, Yamanashi (JP)

(73) Assignee: Eudyna Devices Inc., Yamanashi (JP)

( * ) Notice: Subject to any disclaimer, the term of this patent is extended or adjusted under 35 U.S.C. 154(b) by 336 days.

(21) Appl. No.: 11/093,043

(22) Filed: Mar. 30, 2005

(65) Prior Publication Data
US 2005/0230765 A1    Oct. 20, 2005

(30) Foreign Application Priority Data
Mar. 31, 2004    (JP)    ............... 2004-108508

(51) Int. Cl.
*H01L 29/76*    (2006.01)
*H01L 29/94*    (2006.01)

(52) U.S. Cl. ............ 257/335; 438/286; 438/301; 438/306

(58) Field of Classification Search ............... 257/335; 438/286, 301, 302, 306
See application file for complete search history.

(56) References Cited

U.S. PATENT DOCUMENTS

| | | | |
|---|---|---|---|
| 6,030,869 A * | 2/2000 | Odake et al. ............... | 438/266 |
| 6,168,999 B1 * | 1/2001 | Xiang et al. ............... | 438/286 |
| 6,255,174 B1 * | 7/2001 | Yu ............................. | 438/286 |
| 6,362,058 B1 * | 3/2002 | Houston .................... | 438/286 |
| 6,465,315 B1 * | 10/2002 | Yu ............................. | 438/306 |
| 6,596,594 B1 * | 7/2003 | Guo ........................... | 438/279 |
| 6,830,953 B1 * | 12/2004 | Hu et al. .................... | 438/105 |
| 6,900,085 B2 * | 5/2005 | Ramsbey et al. .......... | 438/197 |
| 2001/0001213 A1 * | 5/2001 | Magri' et al. .............. | 257/328 |

FOREIGN PATENT DOCUMENTS

| | | |
|---|---|---|
| JP | 5-304169 | 11/1993 |
| JP | 7-211917 | 8/1995 |
| JP | 2003-152095 | 5/2003 |

* cited by examiner

*Primary Examiner*—Fernando L. Toledo
(74) *Attorney, Agent, or Firm*—Westerman, Hattori, Daniels & Adrian, LLP.

(57) ABSTRACT

A semiconductor device includes: a semiconductor substrate having a source region and a drain region; and an offset region that is provided in the semiconductor substrate and extends from an edge of a gate electrode toward the drain region. The offset region includes multiple regions having different impurity concentrations formed by an ion implantation with a mask having an opening ratio that changes from the gate electrode to the drain region and by subsequent thermal treatment. The multiple regions include a concentration gradient region that is interposed between adjacent ones of the multiple regions and has the impurity concentration that gradually changes.

10 Claims, 11 Drawing Sheets

US 7,315,062 B2

SEMICONDUCTOR DEVICE, MASK FOR IMPURITY IMPLANTATION, AND METHOD OF FABRICATING THE SEMICONDUCTOR DEVICE

BACKGROUND OF THE INVENTION

1. Field of the Invention

This invention generally relates to a semiconductor device, a mask for impurity implantation, and a method of fabricating the semiconductor device, and more particularly, to techniques that enable the semiconductor device to have a higher breakdown voltage.

2. Description of the Related Art

A device structure having an offset region arranged between a gate electrode and a drain electrode is well known so that the semiconductor device has a higher breakdown voltage.

FIG. 1A is a schematic cross-sectional view of a conventional laterally diffused MOS (hereinafter referred to as LDMOS) transistor having a single offset region. The LDMOS transistor is a MOSFET having a high breakdown voltage, and is widely used for operating at frequencies as high as several GHz. In the LDMOS transistor, an impurity is diffused or implanted in a channel region provided under the gate electrode by laterally diffusing from a source region to a drain region. Thus, the region under the gate electrode has an impurity distribution in which a portion of the region close to the source region is relatively high and another portion close to the drain region is relatively low.

Referring to FIG. 1A, a reference numeral 11 denotes a heavily doped (P$^{++}$) substrate. A reference numeral 12 denotes a p-type epitaxial layer, which is epitaxially grown on a main surface of the substrate 11. A reference numeral 17 denotes a gate oxide film. A reference numeral 18 denotes a gate electrode. A surface region of the p-type epitaxial layer 12 includes a channel region 13 (P), an offset region 14 (N), a drain region 15 (N$^{++}$), and a source region 16 (N$^{++}$). The offset region 14 is arranged between the gate electrode 18 and a drain electrode (not shown), and thereby the distance between the gate electrode 18 and the drain electrode is longer than that between the gate electrode 18 and a source electrode (not shown). In other words, the source electrode and the drain electrode are arranged asymmetrically with respect to the gate electrode. The aforementioned electrode structure is generally referred to as an offset gate electrode structure. Generally, the offset region 14 is designed to be long in order to realize a high drain breakdown voltage.

FIG. 1B shows a profile of an n-type impurity concentration in the offset region of the LDMOS transistor shown in FIG. 1A. Here, a donor concentration is uniformly distributed in the whole offset region ranging from an edge of the gate to an edge of the drain. The impurity concentration significantly changes at the edge of the gate interfaced with a P channel region. The impurity concentration drastically changes at the edge of the drain interfaced with the N$^{++}$ drain region.

FIG. 1C shows a field intensity distribution in the offset region having the above-mentioned impurity profile. As shown in FIG. 1C, the peaks of the electric field intensity appear on an edge of a channel region and an edge of a drain region in the offset region, those steep peaks making it difficult to realize a higher drain breakdown voltage.

The above-mentioned steep peaks are caused due to the drastic changes in the impurity concentrations in interfaces between the offset region and the channel region and between the offset region and the drain region. That is to say, when the impurity concentration significantly changes, the energy band steeply bends according to the difference in the Fermi level between the adjacent regions, and the electric potential greatly changes, so that the peaks appear in the distribution of the electric field intensity. The existence of the peaks in the electric field intensity has to lengthen the offset region more than necessary in order to obtain a given drain breakdown voltage. It is thus difficult to reduce the on-state resistance and parasitic capacitance.

Japanese Patent Application Publication No. 7-211917 (hereinafter referred to as Document 1) discloses a semiconductor device that suppresses the peaks of the electric field near the channel region and the drain region in the offset region to equalize the electric field in the offset region, and achieves the given drain breakdown voltage in the offset gate region having a short length, in order to reduce the on-resistance and parasitic capacitance.

FIG. 2A is a schematic cross-sectional view of the LDMOS transistor having a normal offset region other than an SOI structure, to divide the impurity concentration of the offset region described in Document 1 into two regions having different impurity concentrations. Referring to FIG. 2A, a reference numeral 21 denotes a heavily doped (P$^{++}$) substrate. A reference numeral 22 denotes a p-type epitaxial layer, which is epitaxially grown on a main surface of the substrate 21. A reference numeral 27 denotes a gate oxide film. A reference numeral 28 denotes a gate electrode. A surface region of the p-type epitaxial layer 22 includes a channel region 23 (P), and an offset region 24 (N), a drain region 25 (N$^{++}$), and a source region 26 (N$^{++}$). The offset region 24 includes two regions having different impurity concentrations, a first offset region 24a and a second offset region 24b.

FIG. 2B shows a profile of an n-type impurity concentration in the surface region of the offset region in the LDMOS transistor shown in FIG. 2A. The distributions of the donor concentrations are respectively equalized in both the first offset region 24a extending from the gate edge and the second offset region 24b extending from the edge of the drain. At the interface between the two regions, the impurity concentrations change in a discontinuous manner.

When the impurity concentration distribution in FIG. 2B is compared with that of FIG. 1B, the impurity concentration drastically changes at the edge of the drain region, that is, the interface with the N$^{++}$ drain region, which is same as FIG. 1B. However, the donor concentrations of the first offset region 24a and the second offset region 24b can reduce the change of the impurity concentrations at the edge of the gate interfaced with the P channel region 23.

FIG. 2C shows the electric field intensity distribution in the offset region having the above-mentioned impurity profile. As shown in FIG. 2C, another peak appears in the interface between the first offset region 24a and the second offset region 24b caused resulting from the change of the donor concentration. The existing peaks become lower at the edges in the offset region. This is reflected by a reduction in the change in the impurity concentration at the edge of the gate in the offset region interfaced with the P channel region. The difference in the impurity concentrations is reduced by providing the first offset region 24a and the second offset region 24b having the different donor concentrations. As a whole, the electric field intensity becomes lower and the higher breakdown voltage is obtainable.

FIGS. 3A through 3G illustrate a process of fabricating the LDMOS transistor shown in FIG. 2A. Referring to FIG. 3A, first, the p-type epitaxial layer 22 is grown on the main surface of the heavily doped (P++) substrate 21. Referring to FIG. 3B, the gate oxide film 27 and the gate electrode 28 are formed on the p-type epitaxial layer 22. Next, referring to FIG. 3C, an impurity serving as an acceptor is partially ion-implanted in the p-type epitaxial layer 22 to form the p-type channel region 23. Referring to FIG. 3D, an impurity serving as a donor is ion-implanted to form the first n-type offset region 24a.

Then, referring to a top view of FIG. 3E, a photoresist 29 is provided to partially expose the first offset region 24a. Referring to FIG. 3F, an impurity serving as a donor is ion-implanted to form the second n-type offset region 24b. Finally, referring to FIG. 3G, a photoresist (not shown) is provided for a mask to partially expose the second n-type offset region 24b and the p-type channel region 23, an impurity serving as a donor is ion-implanted shallowly to form the drain region 25 (N++) and the source region 26 (N++).

The offset region disclosed in Document 1, however, includes the first and second offset regions, which are respectively and independently formed. The ion-implantation is performed twice to ion-implant two different donor concentrations. This increases the number of production steps and the production cost.

Japanese Patent Application Publication No. 5-304169 (hereinafter referred to as Document 2) describes a fabricating method of the semiconductor device having two ion-implantation layers having two different impurity concentrations so as to eliminate a masking process. Specifically, two openings having different sizes are arranged in a photoresist serving as a mask for ion-implantation. Ions are implanted through a small opening at an angle at which the semiconductor substrate is not exposed. Then, ions are implanted through the small opening at another angle at which the semiconductor substrate is exposed. Thus, with the once-performed time photolithography process, two different diffusion layers having different concentration distributions are formed in given regions. Japanese Patent Application Publication No. 2003-152095 (hereinafter referred to as Document 3) discloses a fabricating method of an IC having a high breakdown voltage at a low cost. This method forms a first well region and a second well region with a sheet of photo mask and once-performed ion-implantation.

In order to satisfy the demands for the higher breakdown voltage on the semiconductor device, it is not sufficient to realize multiple concentration distributions in the offset region only. The impurity concentration distribution is demanded to realize a mild bending of the energy band. Therefore, the impurity concentration distribution is required to design to realize the higher breakdown voltage, taking into consideration of parameters comprehensively such as thermal treatment temperature in the device fabrication process, time-varying diffusion length of the impurity, and spatial range of the offset region. In addition, it is also demanded that the impurity concentration distribution can be designed freely according to device characteristics.

SUMMARY OF THE INVENTION

The present invention has been made in view of the above-mentioned circumstances and a general object of the present invention is to obtain a higher breakdown voltage of a semiconductor device so as not to change an energy band drastically in an offset region, without adding a new fabricating process.

A more specific object of the present invention is to provide the semiconductor device in which the electric field intensity is reduced at a gate edge to suppress degradation of the device characteristics caused resulting from implantation of a hot electron.

According to one aspect of the present invention, preferably, there is provided a semiconductor device including a semiconductor substrate having a source region and a drain region, and an offset region that is provided in the semiconductor substrate and extends from an edge of a gate electrode toward the drain region, the offset region including multiple regions having different impurity concentrations formed by an ion implantation with a mask having an opening ratio that changes from the gate electrode to the drain region and by subsequent thermal treatment, the multiple regions including a concentration gradient region that is interposed between adjacent ones of the multiple regions and has the impurity concentration that gradually changes.

According to another aspect of the present invention, preferably, there is provided a semiconductor device including a semiconductor substrate having a source region and a drain region; and a field plate electrode provided above the semiconductor substrate, the drain region including a concentration gradient region having a concentration that gradually changes, the concentration gradient region being formed by an ion implantation with a mask having an opening ratio that changes from a gate electrode to the drain region and by subsequent thermal treatment.

According to still another aspect of the present invention, preferably, there is provided a method of fabricating a semiconductor device including a semiconductor substrate having a source region and a drain region, the method comprising implanting an impurity in the semiconductor substrate with a mask having an opening ratio that changes from a gate electrode to the drain region, and thermally treating the semiconductor substrate so that an offset region is formed in the semiconductor substrate so as to extend from an edge of the gate electrode toward the drain region, the offset region having multiple regions including a concentration gradient region that is interposed between adjacent ones of the multiple regions and has the impurity concentration that gradually changes.

According to still another aspect of the present invention, preferably, there is provided a method of fabricating a semiconductor device including preparing a semiconductor substrate, and forming a drain region in the semiconductor substrate by implanting an impurity in the semiconductor substrate with a mask having an opening ratio that changes from a gate electrode to the drain region to be formed.

BRIEF DESCRIPTION OF THE DRAWINGS

Preferred embodiments of the present invention will be described in detail with reference to the following drawings, wherein.

DESCRIPTION OF THE PREFERRED EMBODIMENTS

A description will now be given, with reference to the accompanying drawings, of embodiments of the present invention. In the following description, an ion-implantation method is used to diffuse or implant an impurity in a crystal. However, the present invention may use another method such as a thermal diffusion process. The ion-implantation process must be followed by a thermal treatment (annealing), which may, on the other hand, be omitted for the thermal diffusion method.

A semiconductor device of the present invention is configured so that a dopant is diffused in an offset region and in the vicinity of the offset region, in particular, around an edge of a drain region so that the impurity concentration changes gently in the offset region rather than changing in a discontinuous manner. This gentle change in the impurity concentrations is capable of controlling bending of the energy band in the offset region. The bending of the energy band is thus realized, and the electric field intensity is reduced in the offset region, in an edge of the gate electrode, and in an edge of a drain region. This allows the semiconductor device to obtain a high breakdown voltage. The above-mentioned distribution of the impurity concentration is designed according to parameters of fabricating process conditions of the semiconductor device, such as temperature and time in the thermal treatment process. Accordingly, the semiconductor device is designed with the consideration of desired device characteristics including the diffused distance of the impurity and the distribution of the offset region.

The present invention may be applied to the normal semiconductor device having the offset region. The following description assumes that the semiconductor device denotes the LDMOS transistor. The impurity used as a dopant is, for example, phosphorus (P), arsenic (As) or boron (B), but does not have a limitation in particular.

First Embodiment

Figure 4A:
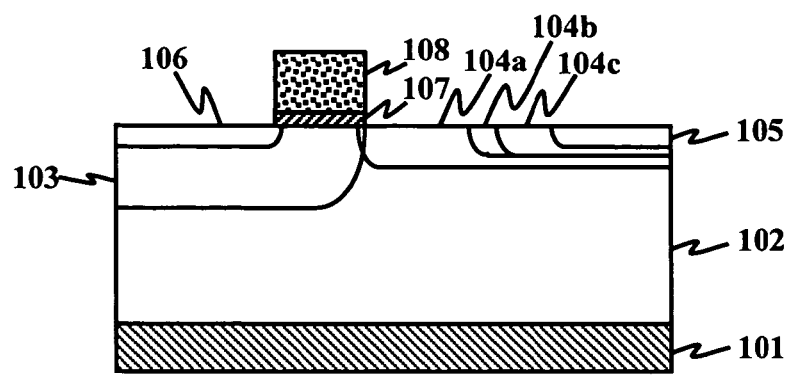
FIG. 4A is a schematic cross-sectional view of an LDMOS transistor in accordance with the present invention.

FIG. 4A is a schematic cross-sectional view of a LDMOS transistor in accordance with the present invention. Referring to FIG. 4A, the LDMOS transistor includes a heavily doped ($P^{++}$) p-type substrate 101, a p-type epitaxial layer 102, which is epitaxially grown on a main surface of the substrate 101. The LDMOS transistor also includes a gate oxide film 107 and a gate electrode 108. A channel region 103 (P), an offset region 104 (N), a drain region 105 ($N^{++}$), and a source region 106 ($N^{++}$) are provided in a surface region of the p-type epitaxial layer 102. The offset region 104 includes three regions having different impurity concentrations, namely, a first offset region 104a, a second offset region 104b, and a third offset region 104c.

Figure 4B:
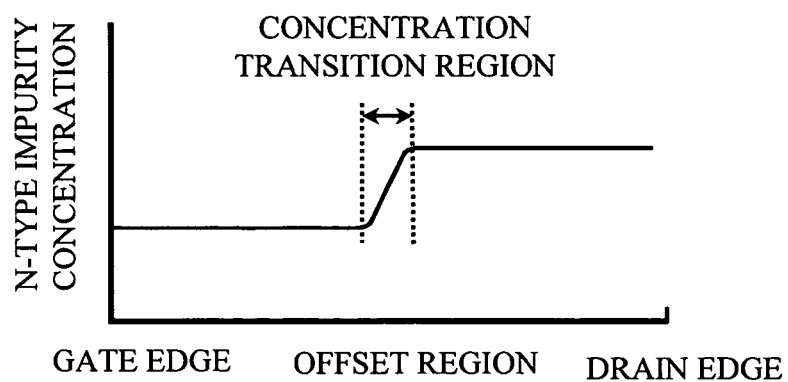
FIG. 4B shows a profile of an n-type impurity concentration in the offset region surface of the LDMOS transistor shown in FIG. 4A.

FIG. 4B shows a profile of an n-type impurity concentration in the offset region of the LDMOS transistor shown in FIG. 4A. The first offset region 104a extending from the edge of the gate and the third offset region 104c extending from the drain region respectively have uniform donor concentration distributions. The second offset region 104b is interposed between the first offset region 104a and the third offset region 104c. The impurity concentration gently changes in the second offset region 104b. The second offset region 104b is also referred to as a concentration transition region or a concentration gradient region. In other words, the semiconductor device in accordance with the present invention includes multiple regions having different impurity concentrations, which regions extend toward the drain region 105 from an edge of the gate oxide film 107. The multiple regions have a concentration transition or gradient region in which the impurity concentration thereof gradually changes.

Figure 1A:
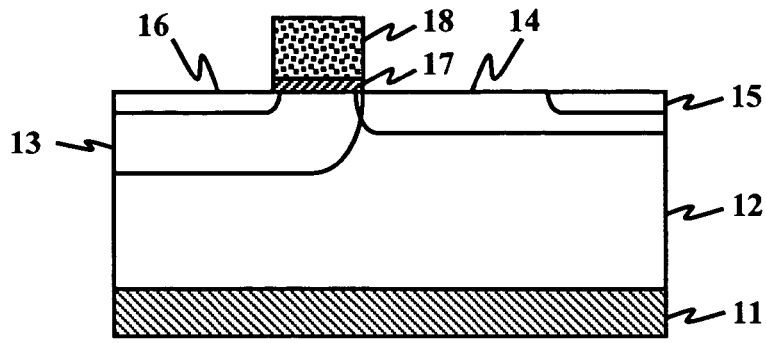
FIG. 1A is a schematic cross-sectional view of a conventional laterally diffused MOS (hereinafter referred to as LDMOS) transistor having a single offset region.
Figure 1B:
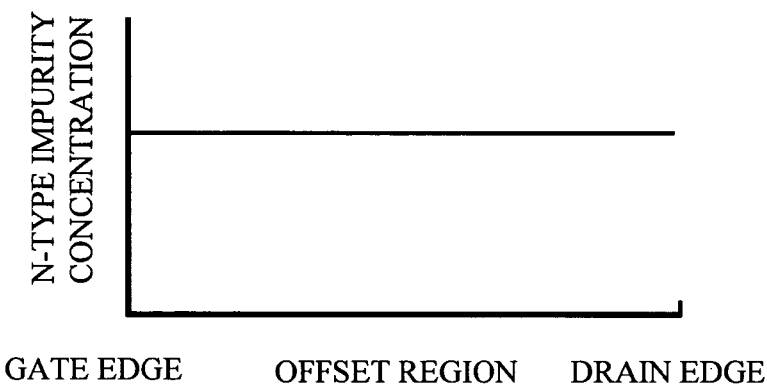
FIG. 1B shows a profile of an n-type impurity concentration in the offset region of the LDMOS transistor shown in FIG. 1A.
Figure 1C:
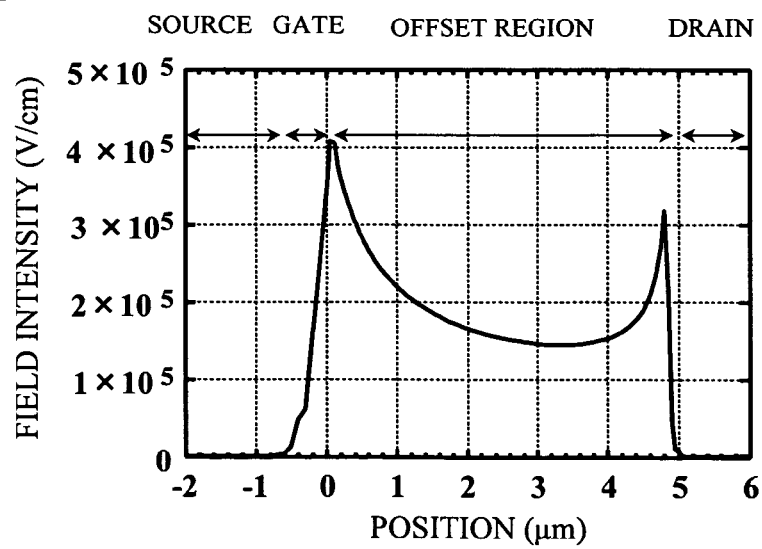
FIG. 1C shows an electric field intensity distribution in the offset region in the case where the offset region has the above-mentioned impurity profile.
Figure 2A:
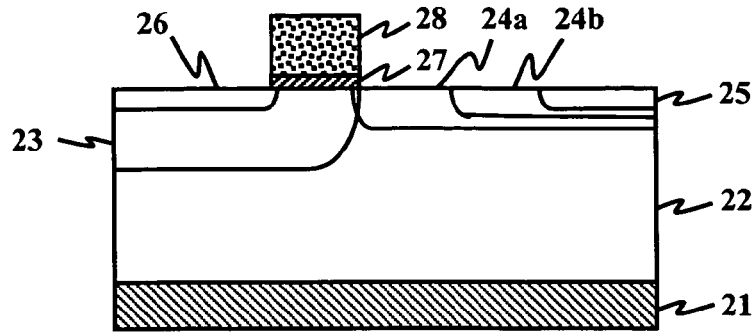
FIG. 2A is a schematic cross-sectional view of an LDMOS transistor having a normal offset region other than a SOI structure, to divide the impurity concentration of the offset region described in Document 1 into two regions.
Figure 2B:
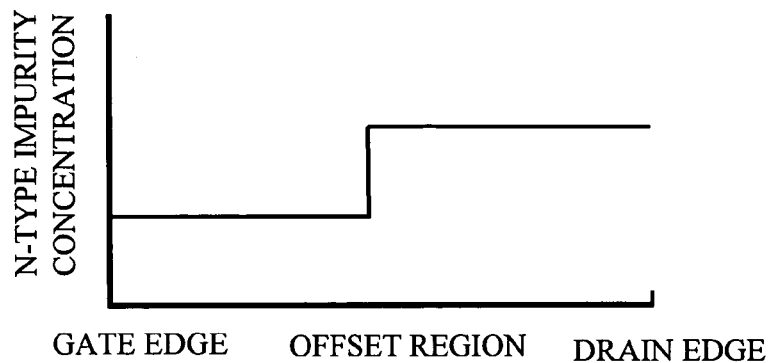
FIG. 2B shows a profile of an n-type impurity concentration in the offset region surface of the LDMOS transistor shown in FIG. 2A.
Figure 2C:
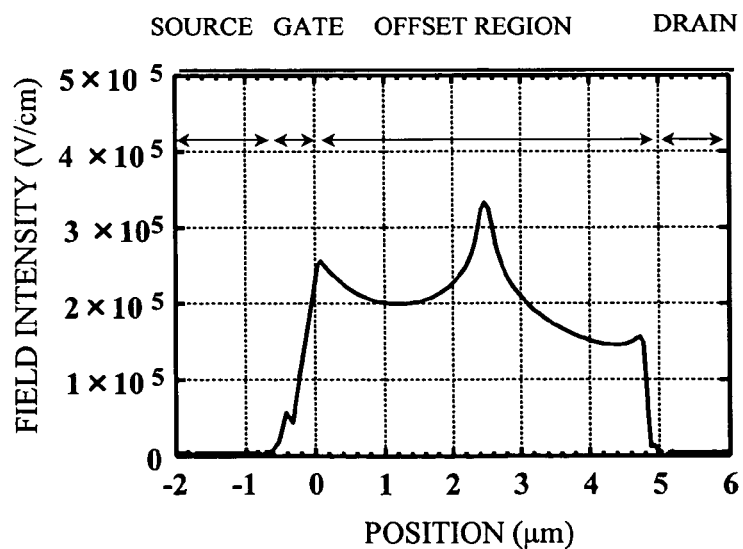
FIG. 2C shows the electric field intensity distribution in the offset region in the case where the offset region has the above-mentioned impurity profile.

When the impurity concentration distribution in FIG. 4B is compared to that shown in FIG. 2B, the impurity concentration of the offset region 104 drastically changes at the edge of the drain region 105, and the impurity concentration of the offset region 104 also drastically changes at the edge of the gate oxide film 107, that is, an interface with the channel region 103. However, the second offset region 104b is provided as the concentration transition region, and the impurity concentration gently changes in the second offset region 104b so that the whole offset region 104 does not have any discontinuous concentration change.

Figure 4C:
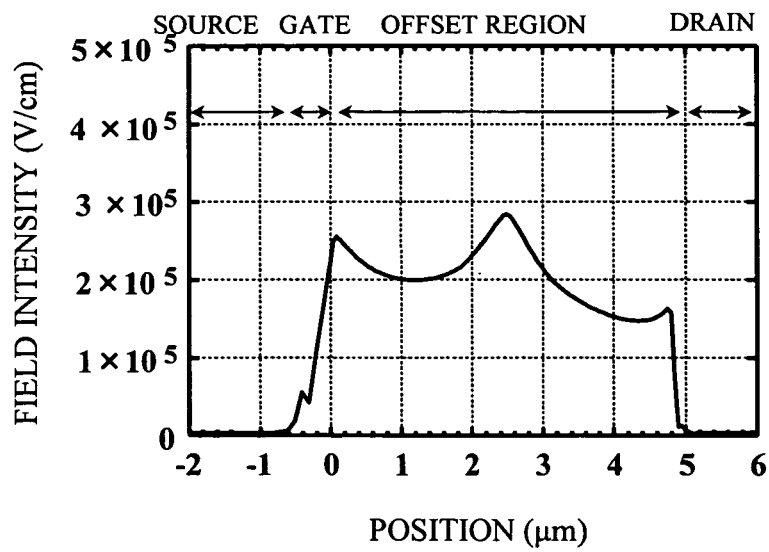
FIG. 4C shows the electric field intensity distribution in the offset region having the above-mentioned impurity profile.

FIG. 4C shows the electric field intensity distribution in the offset region having the above-mentioned impurity profile. As shown in FIG. 4C, there are peaks resulting from different impurity concentrations between the first offset region 104a and the third offset region 104c, and another peak appears in the offset region 104 resulting from different impurity concentrations between the first offset region 104a and the third offset region 104c. The overall height of the peaks in the offset region 104 becomes lower. As a whole, the intensity of the electric field becomes lower and the higher breakdown voltage is thus obtained.

Figure 5A:
FIGS. 5A through 5G illustrate a fabricating process of the LDMOS transistor shown in FIG. 4A.
Figure 5E:
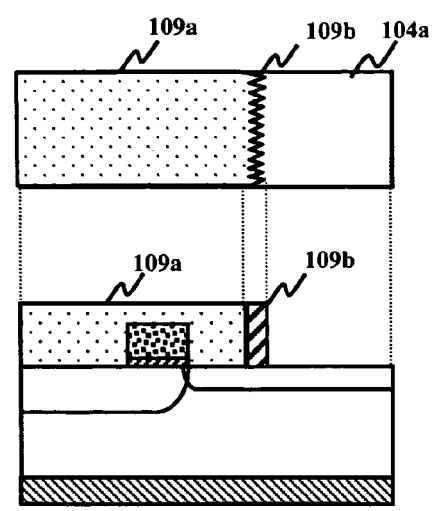
Figure 5B:
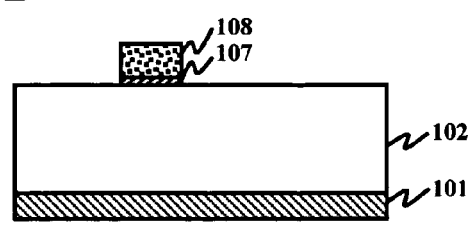
Figure 5C:
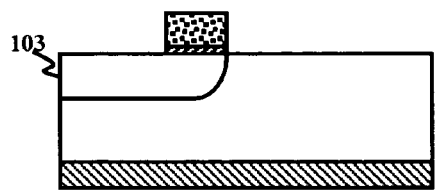
Figure 5F:
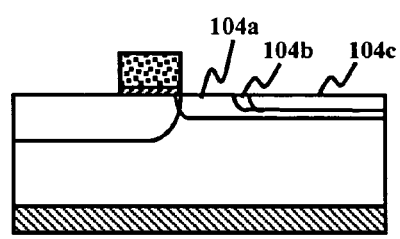
Figure 5D:
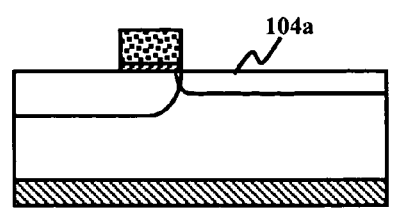

FIGS. 5A through 5G illustrate a process of fabricating the LDMOS transistor shown in FIG. 4A. Firstly, referring to FIG. 5A, the p-type epitaxial layer 102 is grown on the main surface of the heavily doped ($P^{++}$) p-type substrate 101. Next, as shown in FIG. 5B, the gate oxide film 107 and the gate electrode 108 are formed on the p-type epitaxial layer 102. Then, referring to FIG. 5C, an impurity serving as an acceptor is ion-implanted in a partial surface region of the p-type epitaxial layer 102 to form the p-type channel region 103. Referring to FIG. 5D, an impurity serving as a donor is ion-planted to form the first n-type offset region 104a.

Then, referring to a top view of FIG. 5E, photoresists 109a and 109b are provided to expose a part of the first offset region 104a. Referring to FIG. 5F, an impurity serving as a donor is ion-implanted to form the second offset region 104b and the third offset region 104c. The impurity concentrations in the second offset region 104b and the third offset region 104c are the sums of an impurity amount already implanted in the first offset region 104a and the impurity amount further added. Therefore, the spatial distribution of the impurity concentration is heavy at the gate side and light at the drain side in the offset region 104.

Figure 3A:
FIGS. 3A through 3G illustrate a fabricating process of the LDMOS transistor shown in FIG. 2A.
Figure 3E:
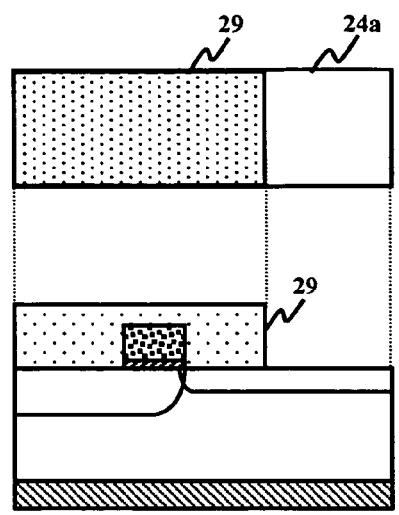
Figure 3B:
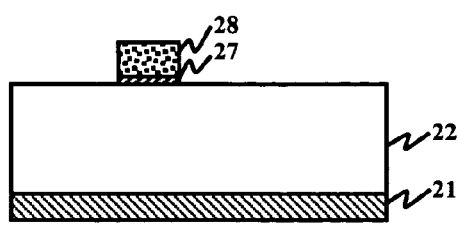
Figure 3C:
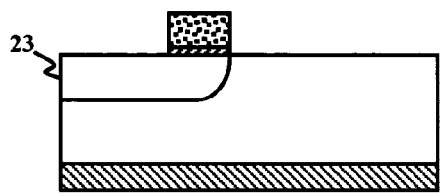
Figure 3F:
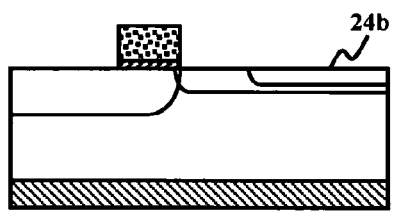
Figure 3D:
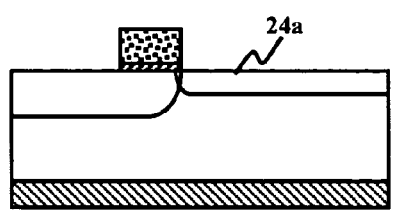
Figure 3G:
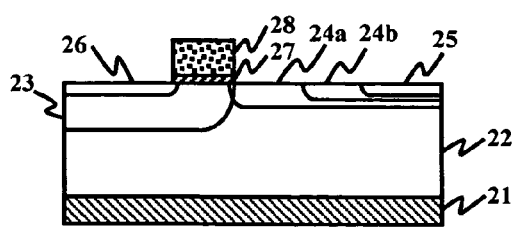

Here, mask shapes of the photoresists 109a and 109b used in the process of providing the differences in the impurity concentrations in the offset region 104 are different from that shown in FIG. 3E. The mask has a saw-edged shape so that an opening ratio of the photoresist 109b may change gently.

Figure 5G:
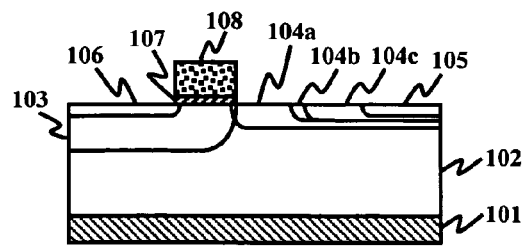

Finally, referring to FIG. 5G, a photoresist, not shown, is provided as a mask to partially expose the third offset region 104c and the channel region 103, and the impurity serving as a donor is ion-implanted shallowly to form the drain region 105 ($N^{++}$) and the source region 106 ($N^{++}$).

Figure 6:
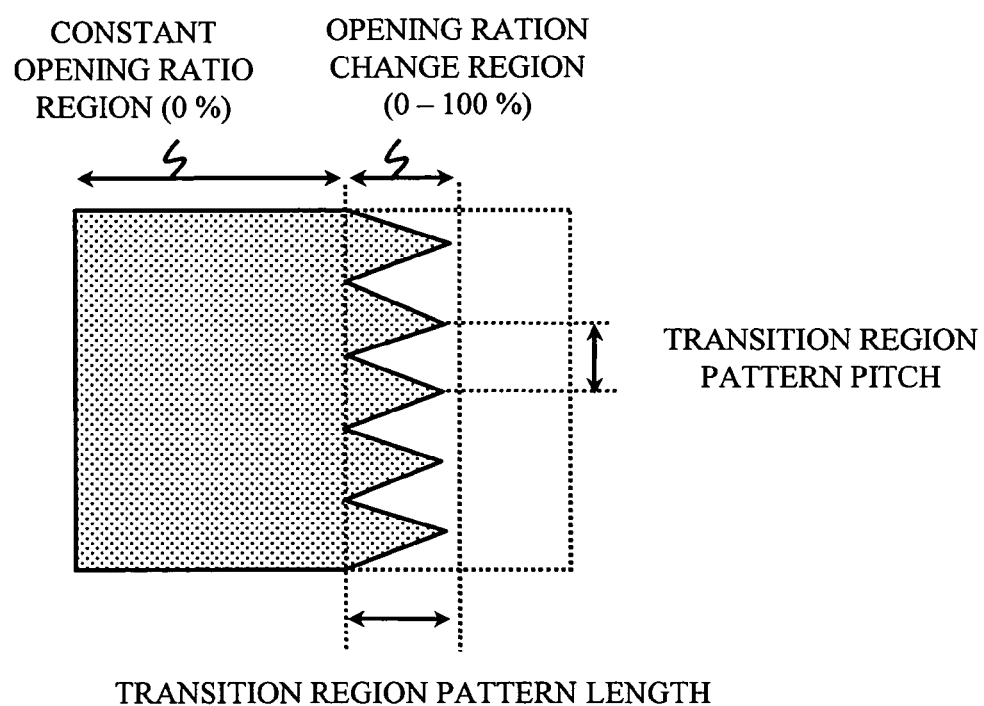
FIG. 6 is an enlarged view of the mask pattern shown in FIG. 5E.

FIG. 6 is an enlarged view of the mask pattern shown in FIG. 5E. The mask pattern includes a constant opening ratio region (0 percent) and an opening ratio change region (0 to 100 percent) having the saw-edged shape. The opening ratio change region is arranged in an end of the constant opening ratio region. The opening ratio changes from 0 to 100 percent from the gate side to the drain side in the opening ratio change region. The ion-implantation is performed with the use of the above-mentioned mask pattern, and the amount of the ion-implantation in the opening ratio change region changes gently. Here, the opening ratio change region corresponds to the second offset region 104b, and the amount of the ion-implantation varies depending on the opening ratio in the second offset region 104b. The amount of ion-implantation is small on the gate side and large on the drain side in the opening ratio change region. The impurity introduced in the offset region is diffused by the thermal treatment process (annealing process) after the ion-implantation. Thus, the impurity concentration can be varied spatially and gently from the gate side toward the drain side. That is to say, the impurity is diffused gently and spatially due to the length of the mask pattern of the concentration transition region, and the pitch of the mask pattern of the concentration transition region in addition to the ion-implantation condition and the subsequent thermal diffusion. In the above-mentioned manner, a desired impurity concentration change profile is obtainable with an arbitrary length of the concentration transition region and an impurity concentration.

It is to be noted that Document 3 describes the impurity introduction method with a square mask. The impurity concentration change profile with the square mask observed after the ion-implantation and the thermal treatment (annealing process) exhibits two different concentration regions. The concentration is heavy around the apexes of the square due to counter diffusion. The concentration is uniform in other regions. As a result, the two different concentration regions are distinctly formed. In contrast, the mask having the saw-edged shape (multiple triangles) has the heaviest concentration around the apexes of the triangle after the impurity diffusion in accordance with the first embodiment of the present invention. The mask covers the second offset region 104b more, as close to the gate, and the concentration varies depending on the changes in the region covered with the mask. It is thus possible to arrange the concentration gradient region where the impurity changes gradually. The profile of the concentration gradient region has two steps of transition for the square shape of mask. The impurity concentration change profile mainly has two steps when the square mask in Document 3 is employed. In contrast, the impurity concentration change profile has multiple steps when the saw-shaped mask is employed in accordance with the first embodiment of the present invention. In addition, the ion-implantation is performed in the second offset region 104b and in the third offset region 104c by a single masking process (including the ion-implantation), and thereby the fabricating process is not complicated.

The impurity that is ion-implanted in the second offset region 104b is thermally diffused from the gate to the drain and to the gate electrode in a later process. The diffusion from the gate to the gate electrode progresses in the direction perpendicular to the direction from the source to the drain. A small impurity concentration change is realized from the gate to the gate electrode, too. Preferably, the pitch or length in the concentration transition region is equal to or less than 0.5 μm, taking into consideration of the thermal distribution length of the impurity during the production process.

The pitch, however, may be set to 0.5 μm or more so that a large thermal profile is intentionally given in the subsequent process of the impurity introduction, for example, annealing for a long time at high temperatures. In view of suppressing the electric field intensity, it is advantageous to configure the pattern length of the concentration transition region as long as possible. However, if it is too long, the current drive capabilities will be degraded. Therefore, the pattern is determined to be longest within an allowable range of the device characteristics.

In the production process shown in FIGS. 5A through 5G, the p-type epitaxial layer has a thickness of 10 μm, the impurity $P^{++}$ for the substrate is boron having a concentration of $1\times10^{19}$ cm$^{-3}$, and phosphorus is the impurity implanted in the offset region 104.

In FIGS. 4A through 4C (and FIGS. 5A through 5G), the LDMOS transistor includes only one concentration transition region. However, if there are multiple concentration transition regions, the much higher breakdown voltage is obtainable.

Figure 7A:
FIGS. 7A through 7G illustrate the ion-implantation process to perform the ion-implantation in the offset region with a resist mask having different opening ratios.
Figure 7B:
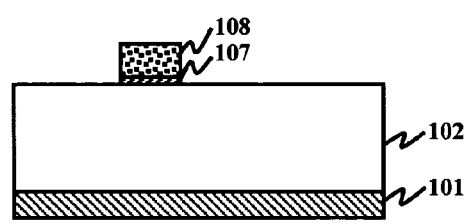
Figure 7E:
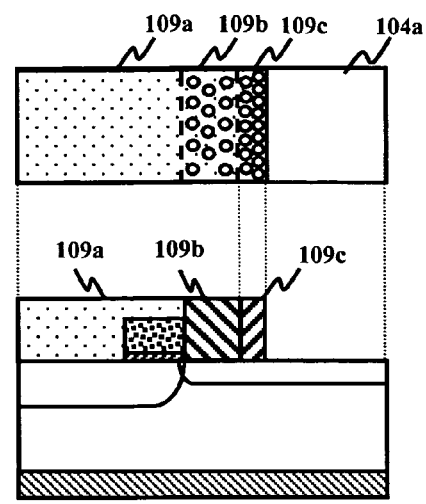
Figure 7C:
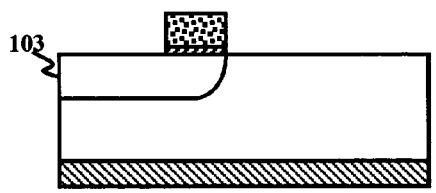
Figure 7F:
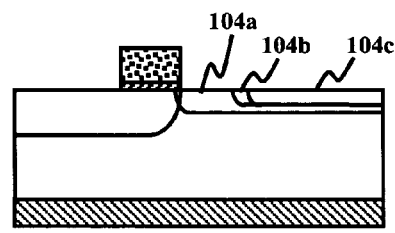
Figure 7D:
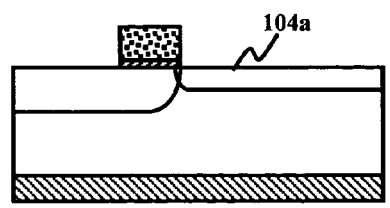

FIGS. 7A through 7G illustrate an ion-implantation process in which the steps of FIGS. 7A through 7D are the same as those of FIGS. 5A through 5D, respectively. The ion-implantation process employs a resist mask for the offset region 104 in which different opening ratios are included. Referring to FIG. 7E, round shape openings having different surface densities are provided on an edge of the photoresist having regions 109a, 109b, and 109c. The photoresist region 109a has 0 percent opening ratio for a complete masking. The photoresist region 109b has the opening ratio smaller than that of the photoresist 109c. The opening ratio also changes gradually in the photoresist region 109c. The ion-implantation is performed in the offset region 104 with the above-mentioned mask. Referring to FIG. 7F, an ion-implantation density is light on the gate side and heavy on the drain side. Also, the impurity concentration changes extremely gently in the offset region 104. It is thus possible to form the offset region 104 having a desired concentration distribution by performing the ion-implantation just once.

Figure 7G:
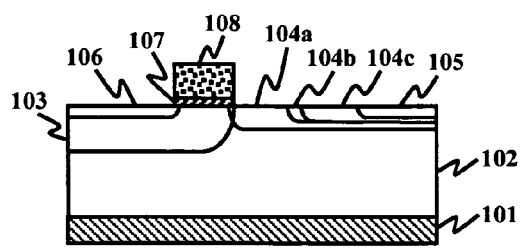

Finally, referring to FIG. 7G, a photoresist (not shown) is provided for a mask to partially expose the third offset region 104c and the channel region 103, an impurity serving as a donor is ion-implanted shallowly to form the drain region 105 ($N^{++}$) and the source region 106 ($N^{++}$).

The above-mentioned mask may include three or more regions to change the opening ratios respectively. In addition, the opening ratio may be changed gradually in a single region to realize the gentle impurity concentration distribution. Further, not only the photoresist but also a patterned silicon nitride film and a patterned silicon oxide film may be used.

Figure 8A:
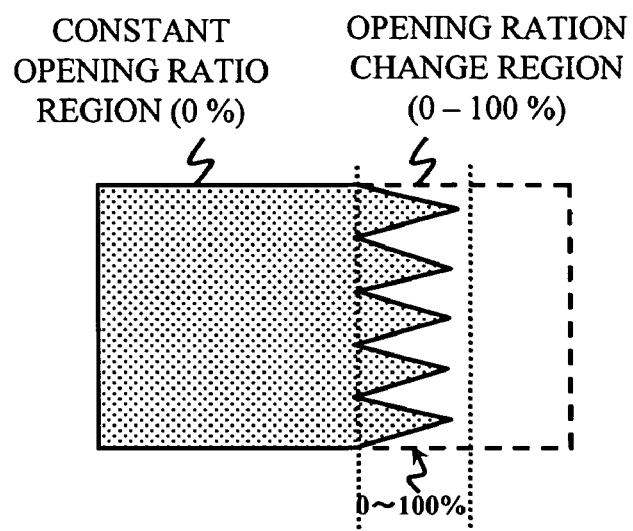
FIGS. 8A through 8D illustrate mask patterns used for forming the offset region of the semiconductor device in accordance with the present invention.
Figure 8B:
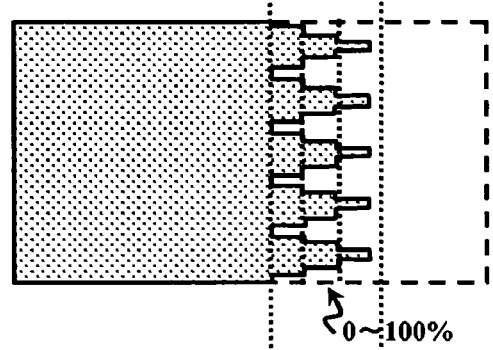
Figure 8C:
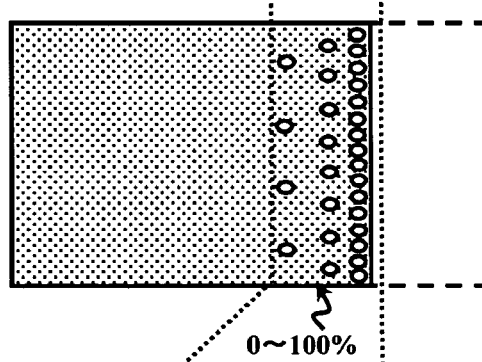
Figure 8D:
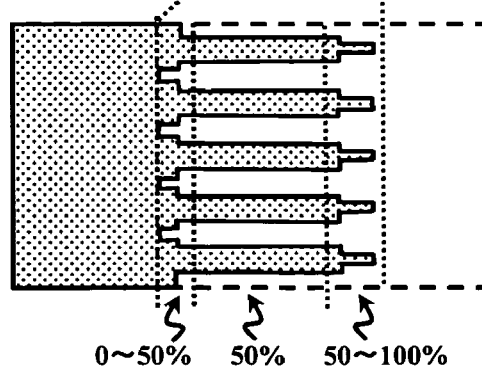

FIGS. 8A through 8D illustrate mask patterns that may be used for forming the offset region of the semiconductor device in accordance with the present invention. The mask patterns include the concentration transition region having the saw-edged shape (triangles) shown in FIG. 8A, the concentration transition region having rectangles of different sizes shown in FIG. 8B, a surface density having minute openings to control the impurity concentration, such as small round-shaped openings arranged in a two-dimensional array shown in FIG. 8C, and a free combination of the above-mentioned patterns as shown in FIG. 8D, for example.

Second Embodiment

A description will be given of a second embodiment of the present invention. The second embodiment of the present invention intends to reduce the electric field intensities at the edge of the gate and the edge of the drain in the semiconductor device having a field plate electrode provided above a semiconductor substrate.

Figure 9A:
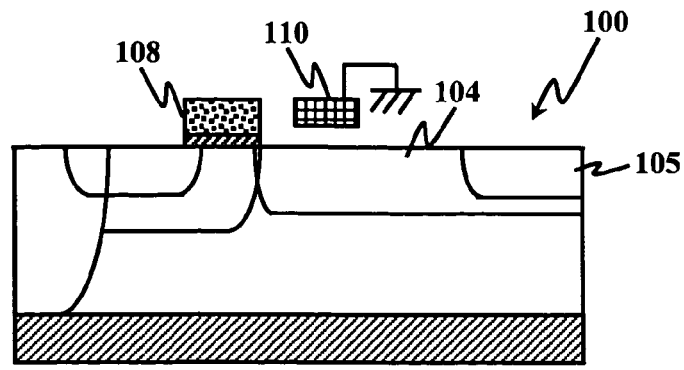
FIG. 9A is a schematic cross-sectional view of an offset-type gate LDMOS transistor 100 having a field plate electrode.

FIG. 9A is a schematic cross-sectional view of an offset-type gate LDMOS transistor 100 having a field plate electrode 110. The field plate electrode 110 is set at a ground potential, and is located in the offset region 104 to reduce the electric field intensity thereof.

Figure 9B:
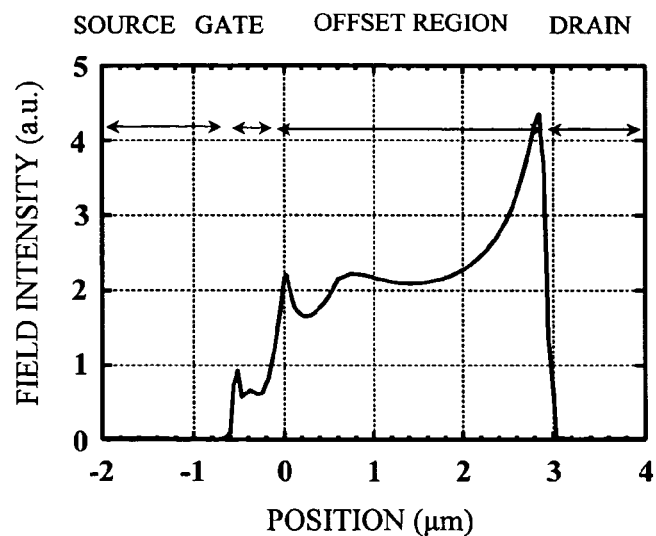
FIG. 9B shows the electric field intensity distribution in the offset region of the LDMOS transistor shown in FIG. 9A.
Figure 9C:
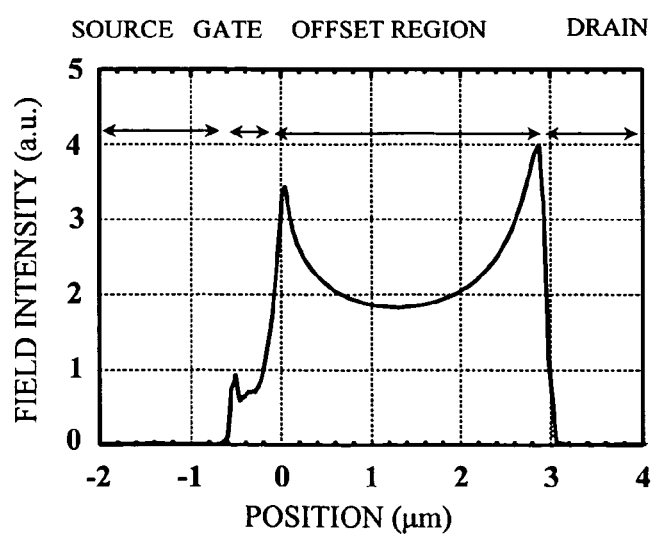
FIG. 9C shows the electric field intensity distribution in the offset region without the electric field plate electrode.

FIG. 9B shows distribution of the electric field intensity in the offset region 104 of the LDMOS transistor shown in FIG. 9A. For comparison, FIG. 9C shows the electric field intensity distribution in the offset region without the field plate electrode. As is obvious from FIGS. 9B and 9C, the electric field intensity distribution in the offset region 104 can be changed by providing the field plate electrode 110. It is also possible to reduce the maximum value of the electric field intensity. The field plate electrode 110 is capable of reducing the electric field intensity at the edge of the gate.

As shown in FIG. 9C, the electric field intensity is large around the gate edge, and more hot carriers are generated around the edge of the gate. The hot electrons are implanted in the gate oxide film to change the threshold value. This degrades the device characteristics. So, the electric field intensity has to be suppressed at the edge of the gate as much as possible. This is because the electric field plate electrode 110 is provided to change the distribution of the electric field intensity. However, in some cases, the electric field intensity might be too large around the edge of the drain.

In the above-mentioned case, the impurity is implanted in the drain region with the gradually changing impurity concentration distribution. It is thus possible to reduce the electric field intensity of the edge of the drain and avoid the above-mentioned inconvenience. That is, the semiconductor device includes a concentration gradient region in accordance with the present invention. The concentration gradient region is arranged at the interface between the offset region and the drain region, and the impurity concentration is changed gradually in the concentration gradient region.

Figure 10A:
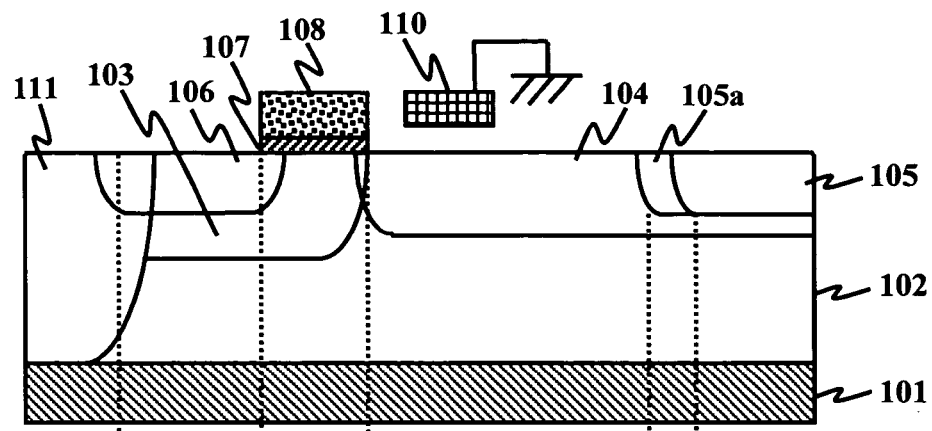
FIG. 10A illustrates the LDMOS transistor in accordance with the second embodiment of the present invention.
Figure 10B:
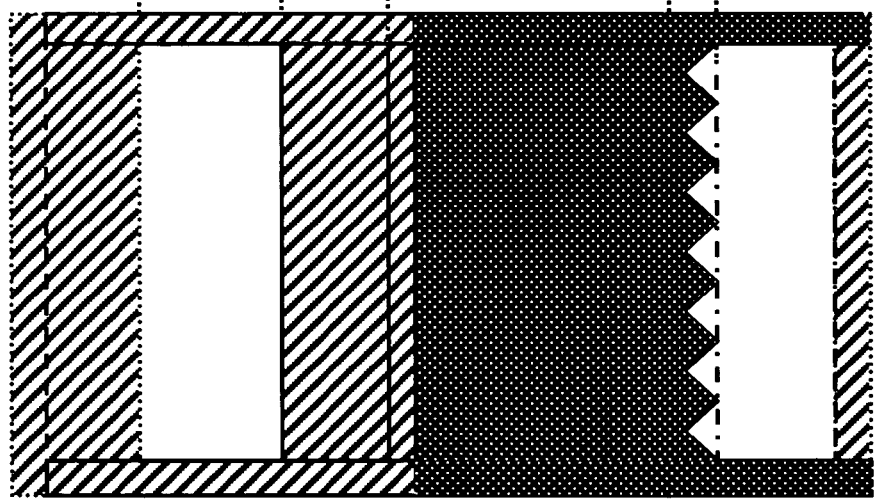
FIG. 10B illustrates a mask pattern to perform the ion-implantation and provide the drain region having a gentle concentration gradient in the LDMOS transistor.

FIG. 10A illustrates the LDMOS transistor in accordance with the second embodiment of the present invention. FIG. 10B illustrates a mask pattern to perform the ion-implantation and provide the drain region having a gentle concentration gradient in the LDMOS transistor. As shown in FIG. 10B, the mask pattern is used for implanting the impurity into the drain region 105 and the source region 106 simultaneously. As shown in FIG. 10A, a contact region ($P^+$) 111 is further included. The ion-implantation is thus performed with the use of the above-mentioned mask, and a transition region 105a is formed in the drain region 105, and is interposed between the drain region 105 and the offset region 104. The impurity concentration is gently changed in the transition region 105a.

Figure 11:
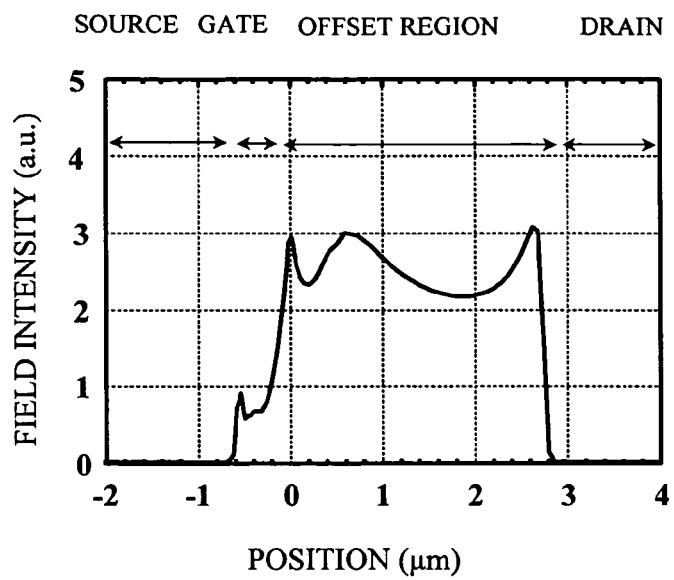
FIG. 11 illustrates the electric field intensity distribution in the offset region and the drain region, in the case where the ion-implantation is performed.

FIG. 11 illustrates the electric field intensity distribution in the offset region and in the drain region, after the ion-implantation is performed. Referring to FIG. 11, the concentration transition region is provided between the drain region and the offset region. The concentration transition region has a gentle impurity concentration gradient. The electric field intensity of the concentration transition region is weakened, and it is thus possible to suppress the electric field on the edge of the gate and enhance the breakdown voltage of the drain at the same time.

Third Embodiment

Figure 12:
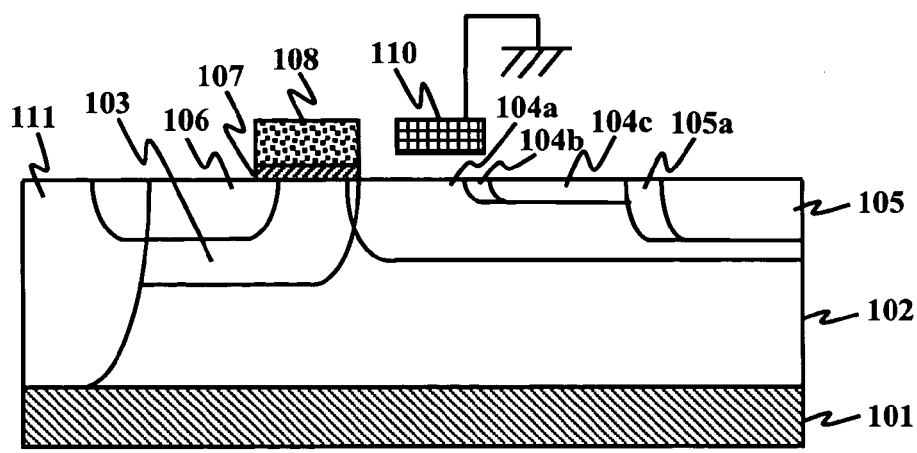
FIG. 12 is a schematic cross-sectional view of the LDMOS in accordance with a third embodiment of the present invention.

A description will be given of a third embodiment of the present invention. FIG. 12 is a schematic cross-sectional view of the LDMOS in accordance with the third embodiment of the present invention. The semiconductor device is configured to include the impurity distribution in the offset region in accordance with the first embodiment of the present invention and the impurity distribution at the drain edge in accordance with the second embodiment of the present invention.

The semiconductor device in accordance with the third embodiment of the present invention may be fabricated by the same process as that of the first embodiment of the present invention. So, the description is omitted here. It is possible to obtain the higher breakdown voltage of the semiconductor device so that the energy band does not change drastically in the offset region. In addition, it is possible to suppress the degradation of the device characteristics due to injection of hot electrons by reducing the electric field intensity at the edge of the gate.

Finally, some aspects of the present invention are summarized below. The semiconductor device has the offset region extending toward the drain region from the edge of the gate insulation film, in which the offset region includes multiple regions having different impurity concentrations. The multiple regions include a first concentration gradient region in which the impurity concentration gradually changes. The first concentration gradient region corresponds to the second offset region 104b in accordance with the first embodiment of the present invention. The semiconductor device in accordance with the present invention includes the field plate electrode. A second concentration gradient region is partially provided in the drain region, in which the impurity concentration gradually changes. The second concentration gradient region corresponds to the transition region 105a. The impurity to be implanted may be any one of phosphorus (P), arsenic (As), and boron (B).

In addition, the mask used in the present invention includes at least one region in which the opening ratio gradually changes from the one edge to the other edge. The above-mentioned mask may have multiple triangles or rectangles in the region in which the opening ratio gradually changes. The region in which the opening ratio gradually changes may include minute openings arranged in two-dimensional array. The mask may be made of any one of the photoresist, the silicon nitride film, and the silicon oxide film.

The fabricating method in accordance with the present invention includes a step of forming the offset region extending toward the drain region from the edge of the gate insulation film. The above-mentioned step of forming the offset region is performed to introduce the impurity with the use of one of the above-mentioned masks. The step of forming the offset region includes a first step for forming the offset region extending toward the drain region from the edge of the gate insulation film, and a second step of forming the drain region. The first and the second steps may be formed simultaneously with the use of the above-mentioned mask. The impurity introduced to the above-mentioned semiconductor is any one of phosphorus (P), arsenic (As), and boron (B). The impurity may be introduced with the ion-implantation method, the thermal diffusion method, or the like.

In accordance with the present invention, the higher breakdown voltage is obtainable without drastically changing the Fermi level in the offset region. Also, the electric field intensity at the gate edge is decreased to suppress the degradation of the device characteristics caused due to implantation of the hot electron.

The present invention may be applied to a compound semiconductor such as GaAs or GaN, in addition to the semiconductor device made of silicon.

The present invention is not limited to the above-mentioned embodiments, and other embodiments, variations and modifications may be made without departing from the scope of the present invention.

The present invention is based on Japanese Patent Application No. 2004-108508 filed on Mar. 31, 2004, the entire disclosure of which is hereby incorporated by reference.

What is claimed is:

1. A semiconductor device comprising:
a semiconductor substrate having a source region and a drain region; and
an offset region that is provided in the semiconductor substrate and extends from an edge of a gate electrode toward the drain region,
the offset region including multiple regions having different impurity concentrations formed by an ion implantation with a mask having a shape that causes an opening ratio to gradually change from the gate electrode to the drain region and by subsequent thermal treatment,
the multiple regions including a concentration gradient region that is interposed between adjacent ones of the multiple regions and has the impurity concentration that gradually changes.

2. A semiconductor device comprising:
a semiconductor substrate having a source region and a drain region; and
a field plate electrode provided above the semiconductor substrate, the drain region including a concentration gradient region having a concentration that gradually changes, the concentration gradient region being formed by an ion implantation with a mask having a shape that causes an opening ratio to gradually change from a gate electrode to the drain region and by subsequent thermal treatment.

3. A method of fabricating a semiconductor device including a semiconductor substrate having a source region and a drain region, the method comprising:
implanting an impurity in the semiconductor substrate with a mask having a shape that causes an opening ratio to gradually change from a gate electrode to the drain region; and
thermally treating the semiconductor substrate so that an offset region is formed in the semiconductor substrate so as to extend from an edge of the gate electrode toward the drain region, the offset region having multiple regions including a concentration gradient region that is interposed between adjacent ones of the multiple regions and has the impurity concentration that gradually changes.

4. The method as claimed in claim 3, wherein the mask has a saw-edged shape on one side thereof.

5. The method as claimed in claim 3, wherein the mask has openings arranged in a two-dimensional array.

6. The method as claimed in claim 3, wherein the mask is made of any one of a photoresist, a silicon nitride film, and a silicon oxide film.

7. The method as claimed in claim 3, wherein the impurity is one of phosphorus (P), arsenic (As), and boron (B).

8. The method as claimed in claim 3, wherein thermally treating the semiconductor substrate is followed by no thermal treatment.

9. A method of fabricating a semiconductor device comprising:
preparing a semiconductor substrate; and
forming a drain region in the semiconductor substrate by diffusing or implanting an impurity in the semiconductor substrate with a mask having a shape that causes an opening ratio to gradually change from a gate electrode to the drain region to be formed.

10. The method as claimed in claim 9, wherein forming the drain region implants the impurity in an offset region formed in the semiconductor substrate.

* * * * *